United States Patent [19]
Yamamuro et al.

[11] Patent Number: 5,268,914
[45] Date of Patent: Dec. 7, 1993

[54] LASER BEAM CONTROL APPARATUS

[75] Inventors: Mikio Yamamuro, Zushi; Yutaka Saito, Kawaguchi, both of Japan

[73] Assignee: Kabushiki Kaisha Toshiba, Kawasaki, Japan

[21] Appl. No.: 892,772

[22] Filed: Jun. 3, 1992

[30] Foreign Application Priority Data

Jun. 28, 1991 [JP] Japan .................. 3-183733

[51] Int. Cl.$^5$ .............................................. H01S 3/13
[52] U.S. Cl. ........................................ 372/31; 372/38; 372/9; 372/29
[58] Field of Search ...................... 372/9, 38

[56] References Cited
U.S. PATENT DOCUMENTS 4,899,348  2/1990  Kiya et al. ........................... 372/9
5,151,910  9/1992  Inuyama et al. .................... 372/31

Primary Examiner—Léon Scott, Jr.
Attorney, Agent, or Firm—Cushman, Darby & Cushman

[57] ABSTRACT

The laser beam control apparatus according to the invention having a photodiode for outputting a current consisting of high and low-frequency components in accordance with the amount of a laser beam emitted from a laser diode. The current output from the photodiode is separated into high and low-frequency components by a CR filter, and the separated low-frequency current is amplified by an amplifier. The current amplified by this amplifier is added to the high-frequency current separated by the CR filter. The resulting sum current is converted into a voltage by an amplifier, and the amount of the laser beam emitted from the laser diode is controlled in accordance with the voltage converted by this amplifier. With this operation, the laser beam output power of the laser diode can be stably controlled in a wide band.

6 Claims, 4 Drawing Sheets

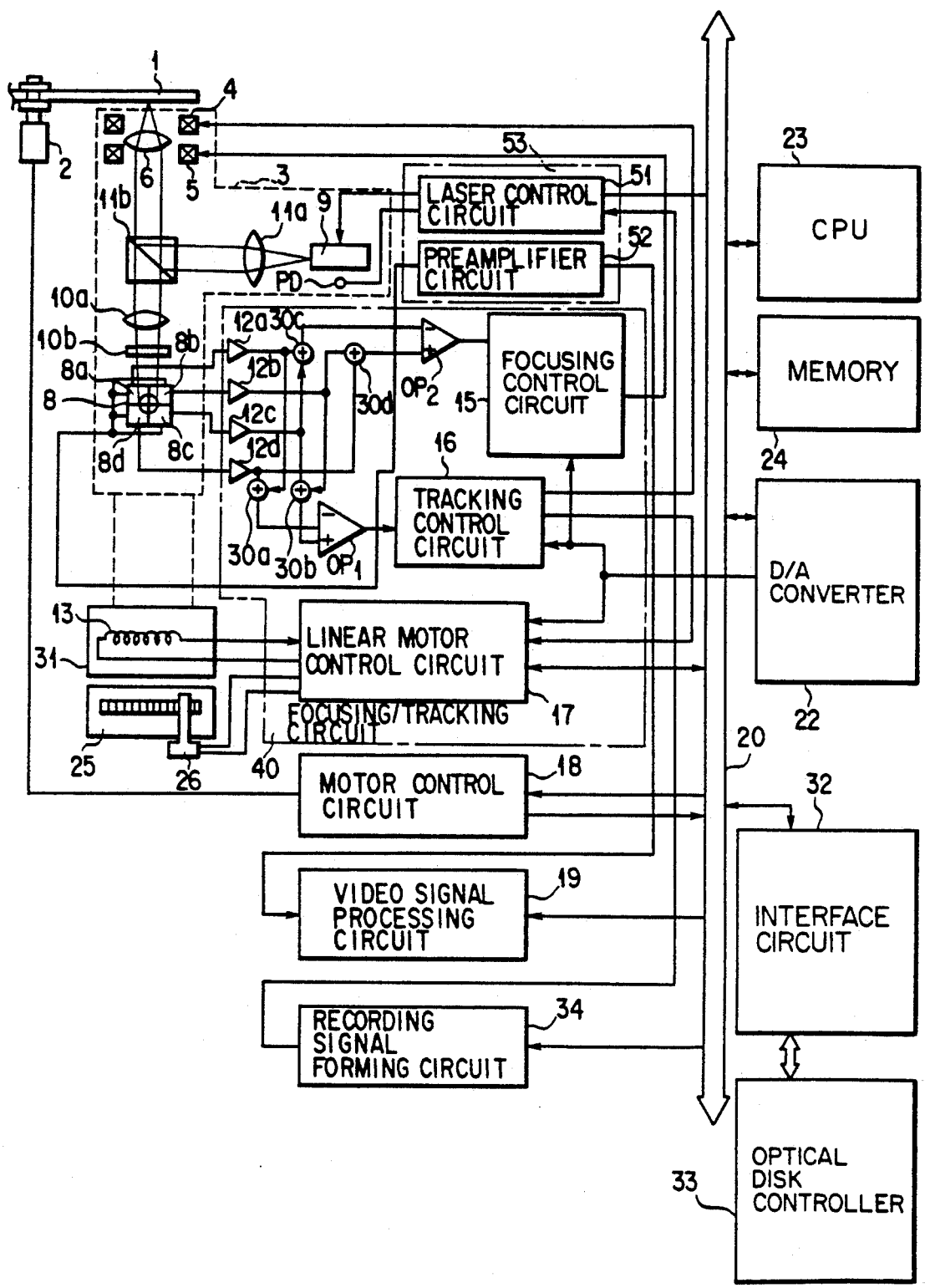
F I G. 1

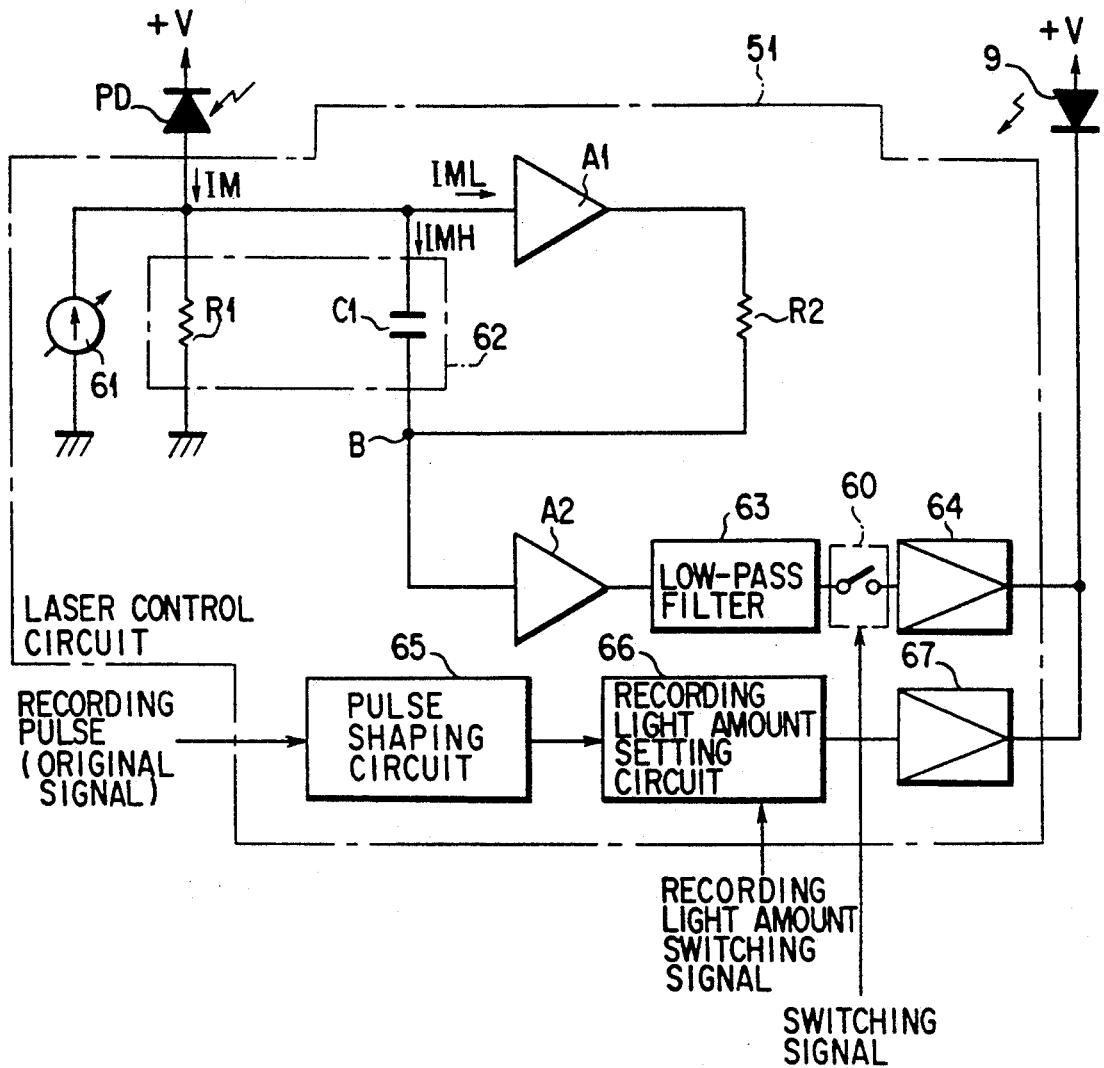
F I G. 2

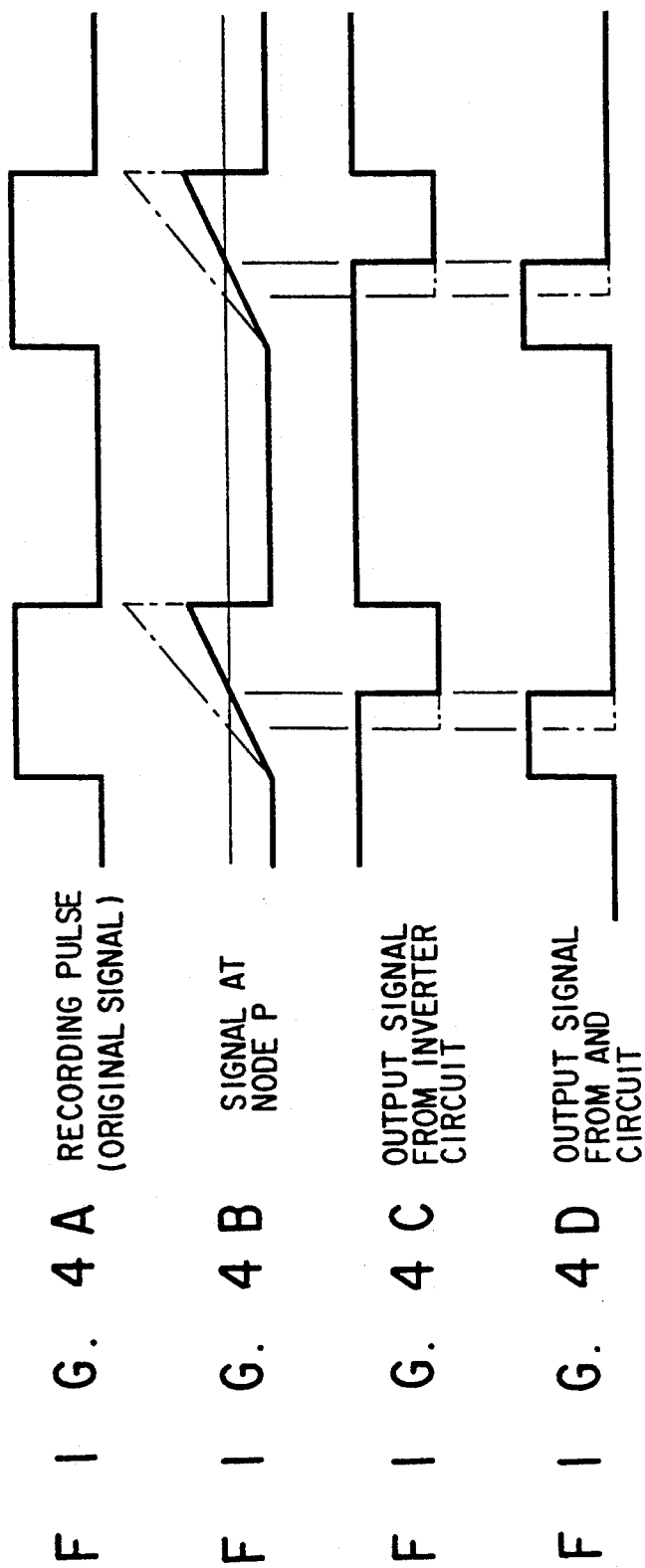

LASER BEAM CONTROL APPARATUS

This application contains subject matter that is generally related to that set forth in copending U.S. patent application Ser. No. 07/852,667.

BACKGROUND OF THE INVENTION

1. Field of the Invention

The present invention relates to an optical disk apparatus and, more particularly, to a laser beam control apparatus for controlling a laser beam irradiated from the light source of the optical head of the control apparatus onto an optical disk.

2. Description of the Related Art

An image filing system uses an optical disk apparatus. In this optical disk apparatus, while an optical disk, on which a large number of tracks are spirally or concentrically formed, is rotated, data is recorded or reproduced on or from the tracks.

A document is two-dimensionally scanned to photoelectrically convert the image data of the document into electrical image data, and this electrical image data is optically recorded on tracks of the optical disk by means of an optical head. In the retrieval mode, this recorded data is retrieved by the optical head to be reproduced as a hard or soft copy.

In the optical disk apparatus, after data is recorded on the optical disk by a laser beam output from a semiconductor laser oscillator (light source) in the optical head, or data recorded on the optical disk is read by converting it into an electrical signal by using a detector in the optical head, and subsequently converting the electrical signal into a video signal.

The amount of the laser beam emitted from the semiconductor laser oscillator is controlled by a laser beam controller. This laser beam controller is designed to correct changes in laser beam with changes in temperature of the semiconductor oscillator by correcting a threshold current by means of feedback control using a monitor current with respect to the laser beam, thereby keeping the light amount constant.

More specifically, a monitor current with respect to a laser beam from the semiconductor laser oscillator is output from a photodiode. The output monitor current is then converted into a voltage. The amount of the laser beam emitted from the semiconductor laser oscillator is controlled in accordance with this voltage.

In such a conventional apparatus, however, since the band of this control is narrow, the laser beam output power of the semiconductor laser oscillator varies due to return light noise. This inevitably influences data and control signals. In addition, due to an insufficient response speed with respect to a recording pulse, light amount control based on a feedback control scheme cannot be performed.

SUMMARY OF THE INVENTION

It is a purpose of the invention to provide a laser beam control apparatus which can stably control the laser beam output power of the light source in a wide band.

According to the present intention, there is provided a laser beam control apparatus comprising:

first generating means for generating a laser beam;

second generating means for generating a current corresponding to an amount of the laser beam generated by said first generating means said generated current having a high-frequency component and a low-frequency component;

means for separating the current, detected by said second generating means, into the high-frequency component and the low-frequency component;

means for amplifying the low-frequency current separated by said separating means;

means for adding the current, amplified by said amplifying means, to the high-frequency current separated by said separating means;

means for converting the sum current obtained by said adding means into a voltage; and means for stabilizing the intensity of the laser beam emitted from said first generating means, in accordance with the voltage output by said converting means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a schematic block diagram showing an optical disk apparatus of an embodiment according to the present invention;

FIG. 2 is a schematic circuit diagram showing the structure of a laser control circuit in FIG. 1;

FIGS. 4A to 4D are timing charts showing signal waveforms at the respective portions of the pulse shaping circuit in FIG. 3.

DETAILED DESCRIPTION OF THE PREFERRED EMBODIMENT

Figure 3:
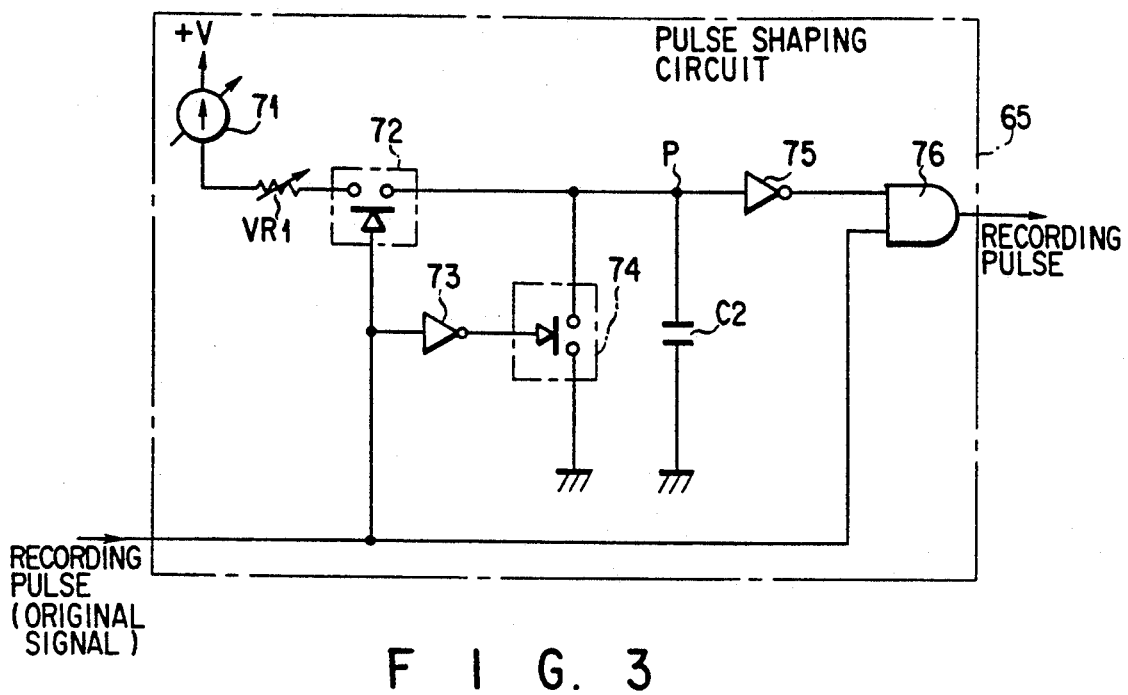
FIG. 3 is a schematic circuit diagram showing the structure of a pulse shaping circuit in FIG. 2.

FIG. 1 schematically shows an optical disk apparatus according to an embodiment of the present invention.

This optical disk apparatus is designed to record data on an optical disk 1, reproduce data from the optical disk 1, or erase data recorded on the optical disk 1 by radiating a focused beam on the optical disk 1.

Grooves (tracks) are spirally or concentrically formed in a surface of the optical disk 1 shown in FIG. 1. The optical disk 1 is rotated by a motor 2 at a constant speed (e.g., 1,800 rmp). This motor 2 is controlled by a motor control circuit 18.

Although the optical disk 1 uses a recording film in which pits are formed, a recording film based on a phase change or a multilayered recording film may be used.

An optical head 3 is arranged near the lower surface of the optical disk 1. Data is recorded/reproduced on/from the optical disk 1 by this optical head 3.

The optical head 3 is fixed to a driving coil 13 as the movable portion of a linear motor 31. The driving coil 13 is connected to a linear motor control circuit 17. A linear motor position detector 26 is connected to this linear motor control circuit 17. Upon detection of an optical scale 25 formed on the optical head 3, the linear motor position detector 26 outputs a position signal.

A permanent magnet (not shown) is arranged on the stationary portion of the linear motor 31. When the driving coil 13 is excited by the linear motor control circuit 17 to drive the linear motor 31, a laser beam emitted from the optical head 3 is moved in the radial direction of the optical disk 1.

As shown in FIG. 1, the optical head 3 comprises an objective lens 6, driving coils 4 and 5 for driving the objective lens 6, a photodetector 8, a laser diode 9 as a semiconductor laser oscillator, a condenser lens 10a, a cylindrical lens 10b, a collimator lens 11a for collimating a laser beam from the laser diode 9, a half prism 11b, and a photodiode PD as a light-receiving element for outputting a current corresponding to the amount of light emitted from the laser diode 9.

The objective lens 6 is suspended from a stationary portion (not shown) through a wire suspension, as shown in FIG. 1. The objective lens 6 is moved by the driving coil 5 in the focusing direction, i.e., the direction of the optical axis of the objective lens 6, and is moved by the driving coil 4 in the tracking direction, i.e., a direction perpendicular to the optical axis of the objective lens 6.

A laser beam emitted from the laser diode 9 driven by a laser control circuit 51 (to be described later) is radiated onto the optical disk 1 through the collimator lens 11a, the half prism 11b, and the objective lens 6. Light reflected by the optical disk 1 is guided to the photodetector 8 through the objective lens 6, the half prism 11b, the condenser lens 10a, and the cylindrical lens 10b.

The monitor photodiode PD is arranged near the laser diode 9. The photodiode PD outputs a current corresponding to the amount of a light beam emitted from the laser diode 9. A monitor current as a detection signal from the photodiode PD is supplied to the laser control circuit 51. The current output from the photodiode PD consists of high- and low-frequency components.

In this case, the laser diode 9, the photodiode PD, and the laser control circuit 51, which serves as a laser beam control apparatus, constitute a laser beam generator.

As shown in FIG. 1, the photodetector 8 is constituted by four photodiodes 8a, 8b, 8c, and 8d.

The cathodes of the photodiodes 8a, 8b, 8c, and 8d of the photodetector 8 are commonly connected to a preamplifier circuit 52 for video signals, with the anodes connected to a focusing/tracking circuit 40.

With this arrangement, currents flow from the cathodes to the anodes in the photodiodes 8a, 8b, 8c, and 8d in accordance with light reflected by the optical disk 1. Video signal processing is performed by using a sum current extracted from the cathodes, whereas focusing (keeping the distance between the optical disk 1 and the objective lens 6 constant)/tracking (tracking a guide groove recorded beforehand on the optical disk 1) is performed by using currents respectively extracted from the anodes.

As shown in FIG. 1, the focusing/tracking circuit 40 comprises amplifiers 12a, 12b, 12c, and 12d, a focusing control circuit 15, a tracking control circuit 16, the linear motor control circuit 17, adders 30a, 30b, 30c, and 30d, and operational amplifiers OP1 and OP2.

An output signal from the photodiode 8a of the photodetector 8 is supplied to one terminal of each of the adders 30a and 30c through the amplifier 12a. An output signal from the photodiode 8b is supplied to one terminal of each of the adders 30b and 30d through the amplifier 12b. An output signal from the photodiode 8c is supplied to the other terminal of each of the adders 30b and 30c through the amplifier 12c. An output signal from the photodiode 8d is supplied to the other terminal of each of the adders 30a and 30d through the amplifier 12d.

An output signal from the adder 30a is supplied to the inverting input terminal of the operational amplifier OP1, whereas an output signal from the adder 30b is supplied to the noninverting input terminal of the operational amplifier OP1. A track difference signal corresponding to the difference between the output signals from the adders 30a and 30b is supplied from the operational amplifier OP1 to the tracking control circuit 16. A track driving signal is then formed by the tracking control circuit 16 in accordance with the track difference signal supplied from the operational amplifier OP1.

The track driving signal output from the tracking control circuit 16 is supplied to the driving coil 4 for the tracking direction. In addition, the track difference signal used by the tracking control circuit 16 is supplied to the linear motor control circuit 17.

An output signal from the adder 30c is supplied to the inverting input terminal of the operational amplifier OP2, whereas an output signal from the adder 30d is supplied to the noninverting input terminal of the operational amplifier OP2. A signal associated with a focusing point corresponding to the difference between the output signals from the adders 30c and 30d is supplied from the operational amplifier OP2 to the focusing control circuit 15. An output signal from the focusing control circuit 15 is supplied to the focusing driving coil 5, thus controlling a laser beam to be always on the optical disk 1.

While focusing and tracking are performed, the sum current based on the outputs from the photodiodes 8a to 8d of the photodetector 8, i.e., the output signals from the adders 30a and 30b, reflects the presence/absence of pits (recorded information) formed in tracks. This signal is converted into a voltage value by the preamplifier circuit 52 for video signals and is supplied to a video signal processing circuit 19. The video signal processing circuit 19 then reproduces image data and address data (a track number, a sector number, and the like).

The laser control circuit 51 causes the laser diode 9 to emit a laser beam corresponding to a reproduction light amount in response to a switching signal from a CPU 23. While the laser beam corresponding to this reproduction light amount is emitted, the laser control circuit 51 drives the laser diode 9 to emit a laser beam corresponding to a recording light amount in accordance with a recording pulse (original signal) supplied from a recording signal forming circuit 41.

The output light amount (reproduction light amount) of the laser diode 9 is controlled by the laser control circuit 51 in accordance with a monitor current from the photodiode PD.

In addition, a recording signal forming circuit 34 as a modulator is arranged at the front stage of the laser control circuit 51. Recording data supplied from an optical disk controller 33 as an external unit through an interface circuit 32 is modulated into a recording pulse by the recording signal forming circuit 34.

The video signal processed by the video signal processing circuit 19 is subjected to demodulation processing or error correction processing in the interface circuit 32 and is subsequently output to the optical disk controller 33.

The optical disk apparatus further includes a D/A converter 22 for communicating information among the focusing control circuit 15, the tracking control circuit 16, the linear motor control circuit 17, and the CPU 23.

The tracking control circuit 16 moves the objective lens 6 in accordance with a track jump signal supplied from the CPU 23 through the D/A converter 22 to move a laser beam by a distance corresponding to one track.

The laser control circuit 51, the focusing control circuit 15, the tracking control circuit 16, the linear motor control circuit 17, the motor control circuit 18, the video signal processing circuit 19, the recording signal forming circuit 34, and the like are controlled by the CPU 23 through a bus line 20. The CPU 23 is controlled by programs stored in a memory 24.

As shown in FIG. 2, the laser control circuit 51 comprises a switch 60, a variable current source 61 for setting a reproduction light amount, a CR filter 62 constituted by a resistor R1 and a capacitor C1, amplifiers A1 and A2, a low-pass filter 63, a driver 64, a pulse shaping circuit 65, a recording light amount setting circuit 66, and a driver 67.

The switch 60 is turned on in response to a switching signal from the CPU 23 when a laser beam corresponding to a reproduction light amount is to be emitted from the laser diode 9.

The variable current source 61 generates a current for causing the laser diode 9 to emit a laser beam in a reproduction light amount corresponding to the characteristics of the optical disk 1.

The CR filter 62 separates a monitor current IM from the photodiode PD into a high-frequency current IMH and a low-frequency current IML. The high- and low-frequency currents IMH and IML from the CR filter 62 are respectively supplied to a node B and the amplifier A1.

The amplifier A1 amplifies the low-frequency current IML supplied from the CR filter 62. The current amplified by the amplifier A1 is supplied to the node B through a resistor R2.

At the node B, the current obtained by amplifying the low-frequency current IML by the amplifier A1 and the high-frequency current IMH supplied from the CR filter 62 are added together. The sum current is then supplied to the amplifier A2.

The amplifier A2 is a current/voltage converter for converting the sum current obtained at the node B into a voltage value. The voltage value from the amplifier A2 is supplied to the low-pass filter 63.

The low-pass filter 63 cuts off unnecessary high-frequency components to prevent an unstable state, e.g., oscillation, of the circuit. An output from the low-pass filter 63 is supplied to the driver 64 through the switch 60.

The driver 64 causes the laser diode 9 to emit reproduction light corresponding to the supplied voltage value.

The pulse shaping circuit 65 adjusts the pulse width of a recording pulse (original signal) supplied from the recording signal forming circuit 34 in accordance with the characteristics of the optical disk 1 and the output characteristic of the laser diode 9.

The recording light amount setting circuit 66 sets a voltage for causing the laser diode 9 to emit a laser beam in a recording light amount corresponding to the characteristics of the optical disk 1. The voltage value of the recording light amount setting circuit 66 can be changed in accordance with a recording light amount switching signal from the CPU 23.

The driver 67 causes the laser diode 9 to emit a laser beam in a recording light amount corresponding to the supplied voltage value.

With this arrangement, in the reproduction mode, the switch 60 is turned on in response to a switching signal from the CPU 23, and the servo loop, of the laser diode 9, based on monitor light is turned on.

Consequently, the monitor current IM supplied from the photodiode PD in accordance with the laser beam emitted from the laser diode 9 is separated into the high-frequency current IMH and the low-frequency current IML by the CR filter 62. The low-frequency current IML is amplified by the amplifier A1 and is subsequently added to the high-frequency current IMH at the node B.

The sum current is converted into a voltage value by the amplifier A2 to be supplied to the driver 64 through the low-pass filter 63 and the switch 60. As a result, the driver 64 causes the laser diode 9 to emit reproduction light corresponding to the supplied voltage value.

With the above-described circuit arrangement, a servo system in which a low-frequency component has a larger gain ,than a high-frequency component can be achieved.

Consequently, a sufficient gain (low-frequency component) can be ensured with respect to great changes in threshold current corresponding to the temperature characteristic of the laser diode 9, and correction processing can be performed to ensure a proper loop gain with respect to changes due to return light noise (high-frequency component).

In addition, the low-pass filter 63 is inserted to cut off unnecessary high-frequency components so as to prevent an unstable state, e.g., oscillation, of the circuit.

With this circuit arrangement shown in FIG. 2, the laser diode 9 can be stably controlled to have a constant output such as reproduction power or erase power.

As shown in FIG. 3, the pulse shaping circuit 65 comprises a variable current source 71, a variable resistor VR1, switches 72 and 74, inverter circuits 73 and 75, a capacitor C2, and an AND circuit 76.

The variable current source 71 selects a current amount corresponding to required adjustment of the pulse width.

The switches 72 and 74 are turned on or off in accordance with a recording pulse supplied, as a control signal, from the recording signal forming circuit 34. The switch 72 is turned on when the control signal is at high level, and is turned off when it is at low level. The switch 74 is operated in accordance with the control signal inverted by the inverter circuit 73. The switch 74 is turned on when the control signal at low level, and is turned off when it is at high level (the switches 72 and 74 are always set in opposite states).

For example, when the recording pulse shown in FIG. 4A changes from low level to high level, the switch 72 is turned on, while the switch 74 is turned off. Subsequently, a current from the variable current source 71 flows into the capacitor C2 to increase the potential. As a result, the potential at a node P is increased, as shown in FIG. 4B.

When the potential at the node P exceeds a predetermined threshold level, the potential of the output terminal of the inverter circuit 75 changes from high level to low level, as shown in FIG. 4C. The output of the AND circuit 76 is set at high level when both the recording pulse from the recording signal forming circuit 34 and the output from the inverter circuit 75 are set at high level, as shown in FIG. 4D.

By changing the current amount of the variable current source 71, the gradient of the potential rise at the node P changes.

When the recording pulse from the recording signal forming circuit 34 is set at low level, the switch 72 is turned off, and the switch 74 is turned on. Consequently, the potential at the node P goes to low level, and the output of the AND circuit 76 goes to low level.

With this circuit arrangement, pulse shaping (adjustment) can be performed by selectively switching the current value of the variable current source 71.

Figure 5:
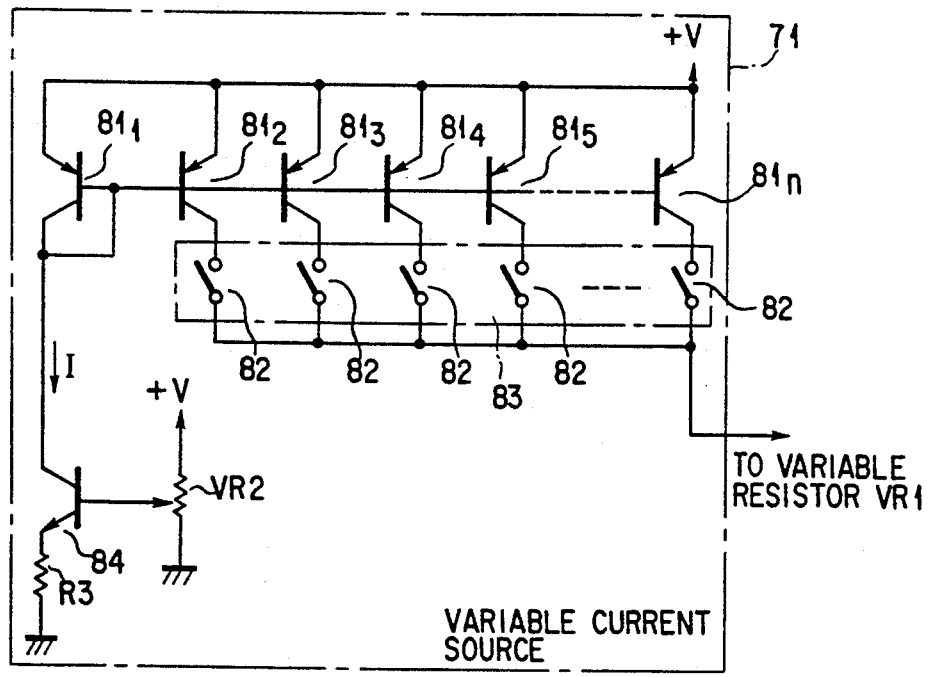
FIG. 5 is a schematic circuit diagram showing the structure of a variable current source in FIG. 3.

A variable circuit in the variable current source 71 will be described below with reference to FIG. 5. The variable current source 71 is a current source constituted by transistors $81_1$ to $81_n$. Switches 82 are respectively connected to the emitters of the transistors $81_2$ to $81_n$. When one of the switches 82 is turned on, a corresponding one of the transistors ($81_2$ to $81_n$) is operated.

The switches 82 constitute a multiplexer 83. The switches 82 are ON/OFF-operated by electrically operating the multiplexer 83, thereby controlling a current I.

By using the variable current source 71 having such an arrangement in the pulse shaping circuit 65 shown in FIG. 3, a reference current amount is determined by one adjusting operation of a variable resistor VR2. Subsequently, adjustment of the pulse width can be freely performed by selectively operating the multiplexer 83.

However, in order to variably change the pulse width with high precision, the characteristics of the respective transistors of the variable current source 71 must be matched with each other. Therefore, by forming the pulse shaping circuit 65 in a large scape integrated circuit (LSI), the above-described circuit can be put into practice.

A laser output control band and a data signal band will be described next. If the band of control of the laser beam output power of the laser diode 9 is expanded, the laser beam output power of the laser diode 9 can be stabilized, and return light noise can be reduced.

Return light noise appears especially as noise of a reproduction data signal and a control signal (focusing/tracking signal).

If wide-band control of a laser beam emitted from the laser diode 9 is performed, although the S/N ratio within the control band is increased, the S/N ratio outside the control band is decreased.

For this reason, in order to increase the S/N ratios of reproduction and control signals by wide-band control of the laser beam output power of the laser diode 9, the control band must be expanded to the bands of reproduction and control signals or more.

If the preamplifier circuit 52 for reproduction data signals and the laser control circuit 51 are integrated into a large scale integrated circuit (LSI) 53, this LSI 53 can be arranged on the optical head 3 or near the optical head 3.

With such a discrete circuit arrangement, short wiring can be realized, the band of the overall circuit can be expanded, and its stability can be improved, thus realizing a circuit system having a high S/N ratio. In addition, the size of the apparatus can be further reduced.

The band of the overall circuit can be expanded, and its stability can be improved by integrating the preamplifier circuit 52 for reproduction data signals and the laser control circuit 51 into the large scale integrated circuit (LSI) 53, and arranging volume dials for controlling a laser beam, a recording pulse width, balance, and the like on the optical head 3 or near it, together with the LSI 53.

If circuits having different functions or the grounds inside the LSI 53 having large and small-power circuits are separated from each other, the respective circuits can be stabilized, and interference between the respective circuits can be prevented.

In addition, if circuits having different functions or the power sources inside the LSI 53 having large and small-power circuits are separated from each other, the respective circuits can be stabilized, and interference between the respective circuits can be prevented.

Furthermore, if circuits having different functions or portions at which changes in large current and changes in small current respectively occur in the LSI 53 having large and small-power circuits are arranged apart from each other, and reference voltage sources for the respective circuit systems are formed in different circuits, the respective circuits can be stabilized, and interference between the respective circuits can be prevented.

Moreover, if the laser diode 9 and the photodiode PD are separated from each other, a reverse bias voltage to the photodiode PD can be arbitrarily selected. Therefore, the photodiode PD can be freely selected and the reverse bias voltage to the photodiode PD can be freely set regardless of the driving voltage to the laser diode 9.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A laser beam control apparatus comprising:
   first generating means for generating a laser beam;
   second generating means for generating a current corresponding to an amount of the laser beam generated by said first generating means said generated current having a high-frequency component and a low-frequency component;
   means for separating the current, detected by said second generating means, into the high-frequency component and the low-frequency component;
   means for amplifying the low-frequency current separated by said separating means;
   means for adding the current, amplified by said amplifying means, to the high-frequency current separated by said separating means;
   means for converting the sum current obtained by said adding means into a voltage; and
   means for stabilizing the intensity of the laser beam emitted from said first generating means, in accordance with the voltage output by said converting means.

2. An apparatus according to claim 1, wherein at least some of said separating means, said amplifying means, said adding means, said converting means, and said stabilizing means are highly integrated.

3. An apparatus according to claim 1, wherein said separating means comprises a CR filter consisting of a capacitor and a resistor.

4. An apparatus according to claim 1, wherein said stabilizing means comprises a low-pass filter for cutting off unnecessary high-frequency components from the voltage output by said converting means, and a driver for causing said first generating means to generate a laser beam in accordance with a voltage value supplied from said low-pass filter.

5. An apparatus according to claim 1, wherein said detecting means comprises a photodiode.

6. An apparatus according to claim 1, wherein said first generating means comprises a semiconductor laser oscillator.

* * * * *